US009065234B2

(12) United States Patent
Holste et al.

(10) Patent No.: US 9,065,234 B2
(45) Date of Patent: Jun. 23, 2015

(54) CONNECTING CONTACT

(75) Inventors: Dieter Holste, Detmold (DE); Ulrich Rosemeyer, Schieder Schwalenberg (DE)

(73) Assignee: PHOENIX CONTACT GMBH & CO. KG, Blomberg (DE)

( * ) Notice: Subject to any disclaimer, the term of this patent is extended or adjusted under 35 U.S.C. 154(b) by 116 days.

(21) Appl. No.: 13/808,429

(22) PCT Filed: Jun. 29, 2011

(86) PCT No.: PCT/EP2011/060973
§ 371 (c)(1),
(2), (4) Date: Apr. 18, 2013

(87) PCT Pub. No.: WO2012/004177
PCT Pub. Date: Jan. 12, 2012

(65) Prior Publication Data
US 2013/0192874 A1    Aug. 1, 2013

(30) Foreign Application Priority Data
Jul. 6, 2010  (DE) .......................... 10 2010 026 312

(51) Int. Cl.
*H01L 23/495* (2006.01)
*H01R 43/16* (2006.01)
(Continued)

(52) U.S. Cl.
CPC ........... *H01R 43/16* (2013.01); *Y10T 29/49204* (2015.01); *H01L 23/49555* (2013.01);
(Continued)

(58) Field of Classification Search
CPC ................................. H01R 43/16; H01B 1/02

USPC .......................................... 174/126.2; 29/874
See application file for complete search history.

(56) References Cited

U.S. PATENT DOCUMENTS 4,777,564 A    10/1988  Derfiny et al.
5,304,843 A *  4/1994  Takubo et al. ................ 257/670
(Continued)

FOREIGN PATENT DOCUMENTS

JP    H09-13007 A     5/1997
JP    H09-232499 A    9/1997
(Continued)

OTHER PUBLICATIONS

Darveaux, "Improved Lead Design for Surface Mount Packages", Motorola Technical Developments, (1994), vol. 23, p. 101.
(Continued)

*Primary Examiner* — Caleb Henry
(74) *Attorney, Agent, or Firm* — Nath, Goldberg & Meyer; Jerald L. Meyer; Katelyn J. Bernier

(57) ABSTRACT

A connecting contact for SM D-components includes a metal material and the metal material at least partially comprises a coating with a different metal material. The connecting contact has a substantially laminar contact area for solderable contact to a board and comprises edge regions. At least one segment of the edge region is at a distance from the laminar contact area, so that a soldered fillet is formed for a soldered contact to a board. Also, a method for producing connecting contacts for SM D-components for solderably contacting a board includes the steps of punching metal strips, bending the metal strips so that a conducting region and a laminar contact area are produced, and forming the edge areas at the laminar contact area. At least one segment of the edge area is at a distance from the laminar contact area.

5 Claims, 6 Drawing Sheets

Figure 1:
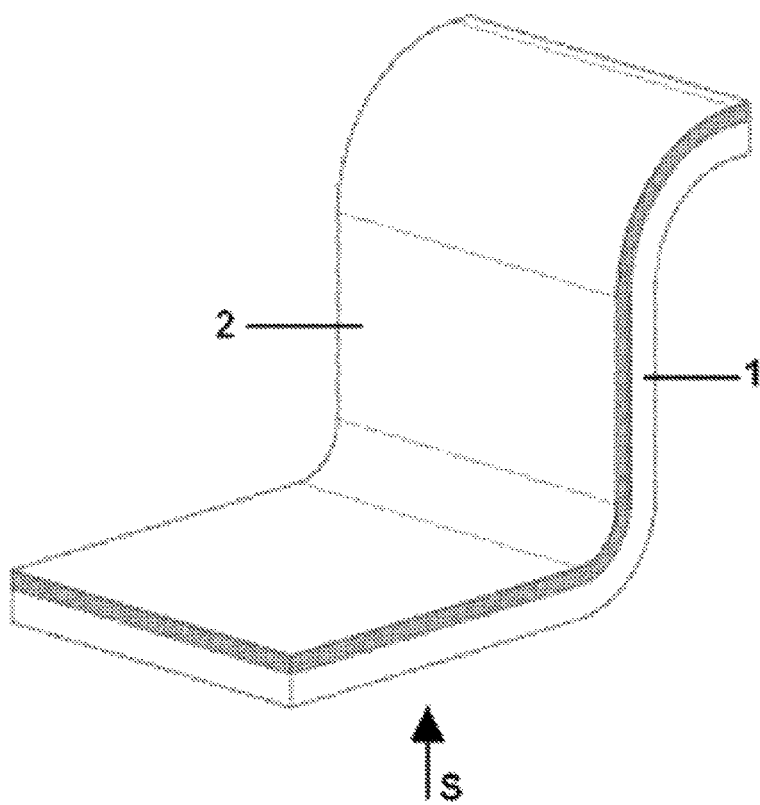

(51) Int. Cl.
*H05K 3/34* (2006.01)
*H01B 1/02* (2006.01)

(52) U.S. Cl.
CPC ........ *H01L23/49582* (2013.01); *H05K 3/3426* (2013.01); *H05K 2201/1031* (2013.01); *H05K 2201/10984* (2013.01); *H01B 1/02* (2013.01); *H01L 2924/0002* (2013.01)

(56) References Cited

U.S. PATENT DOCUMENTS

| | | | | |
|---|---|---|---|---|
| 5,363,279 | A * | 11/1994 | Cha | 361/767 |
| 5,703,407 | A * | 12/1997 | Hori | 257/783 |
| 5,925,927 | A | 7/1999 | Orcutt | |
| 5,986,209 | A * | 11/1999 | Tandy | 174/530 |
| 6,462,424 | B1 | 10/2002 | Seki et al. | 257/778 |
| 6,634,100 | B2 * | 10/2003 | Akram et al. | 29/874 |
| 7,093,358 | B2 * | 8/2006 | Akram et al. | 29/874 |
| 7,216,424 | B2 * | 5/2007 | Wang | 29/843 |
| 7,937,831 | B2 * | 5/2011 | Sigg et al. | 29/845 |
| 7,939,381 | B2 * | 5/2011 | Tong | 438/123 |
| 2005/0200447 | A1 * | 9/2005 | Chandler et al. | 338/25 |
| 2008/0289853 | A1 * | 11/2008 | Sakai et al. | 174/126.2 |
| 2013/0005163 | A1 * | 1/2013 | Holste et al. | 439/83 |

FOREIGN PATENT DOCUMENTS

| | | |
|---|---|---|
| JP | 10-284666 A | 10/1998 |
| JP | 11-145367 A | 5/1999 |
| JP | 2003-124074 A | 4/2003 |

OTHER PUBLICATIONS

"Bent Leads of LSI Package (All Surface Mount Parts)", (1993), vol. 36, No. 11, p. 215.

Office Action issued in Japanese Application No. 2013-517288 dated Sep. 30, 2014, three (3) pages.

* cited by examiner

CONNECTING CONTACT

This is a National Phase Application filed under 35 U.S.C §371 as a national stage of International Application No. PCT/EP2011/060973, filed Jun. 29, 2011, claiming the benefit from German Patent Application No. 10 2010 026 312.5, filed Jul. 6, 2010, the entire content of each of which is hereby incorporated by reference in its entirety.

The invention relates to a connecting contact for SMD components.

Surface mounted devices, or SMD components, are used in numerous products because they can be easily assembled on circuit boards and easily soldered.

Integrated circuits and electromechanical components used in SMD technology are equipped with a multiplicity of connecting contacts, which are intended for surface soldering.

In order to fabricate these connecting contacts on an economically reasonable scale, in the past they have generally been produced from pretinned steel strips or wires.

The disadvantage of this procedure, however, is that as a result of cutting, at least segments of the cut edges are without pretinning, and consequently, it has been necessary to post-process the cut edges in order to achieve stable soldering.

And in addition to the fact that an added production step is necessary, each step necessarily also involves a certain level of defectiveness.

In particular, it is known that with galvanic surface post-finishing, layer thicknesses can be controlled only inadequately, and as a result, generally more irregular and, in some areas, thicker layers are produced.

Moreover, galvanically produced layers generally require a nickel sub-layer in order to prevent the formation of whiskers.

Each individual disadvantage ultimately results in a less stable soldered connection overall, i.e., the SMD connection is able to absorb only low tensile forces (several newtons). Such tensile forces are generated on the component itself as a result of thermal factors, vibrations, etc., and result in spiral stress and therefore in damage to the soldered connection.

The invention therefore addresses the problem of eliminating one disadvantage or multiple disadvantages of the prior art in an inventive manner.

This problem is solved by a connecting contact for SMD components for solderable contacting with a circuit board. The connecting contact comprises a metallic material, and the metallic material at least partially comprises a coating with a different metallic material. The connecting contact has a substantially laminar contact area for solderable contacting with a circuit board, and the laminar contact area has edge regions. At least one segment of the edge region protrudes from the laminar contact area in such a way that, when contacted with a circuit board via soldering, a soldered fillet forms.

In a further embodiment of the invention, the connecting contact has a conductive section, wherein an edge region is positioned substantially parallel to the conductive section on the laminar contact area.

In another embodiment of the invention, the edge region protrudes up to twenty thicknesses of material above the laminar contact area.

In a further embodiment of the invention, the edge region protrudes only up to two material thicknesses above the laminar contact area.

According to a further embodiment of the invention, sections of the edge region form an angle of approximately 45° up to approximately 90° with the laminar contact area.

In yet another embodiment of the invention, the connecting contact has an edge region which is arranged substantially perpendicular to the conductive section on the surface contact area.

The invention further solves the problem with a method. The method for producing connecting contacts for SMD components for solderable contacting with a circuit board comprises the step of punching metal strips, the step of bending the metal strips to produce a conductive section and a laminar contact area, and the step of forming edge regions on the laminar contact area, such that at least one segment of the edge region protrudes from the laminar contact area such that, when contacted with a circuit board via soldering, a soldered fillet is formed.

In one embodiment of the invention, the step of forming edge regions comprises bending.

In another embodiment of the invention, the step of forming and the step of bending comprise a single step.

According to a further embodiment of the invention, the steps of forming and of bending and of punching are implemented in a single, common step.

In what follows, the invention will be specified in greater detail within the context of preferred embodiments, in reference to the attached set of documents.

THE DRAWINGS SHOW

Figure 2:
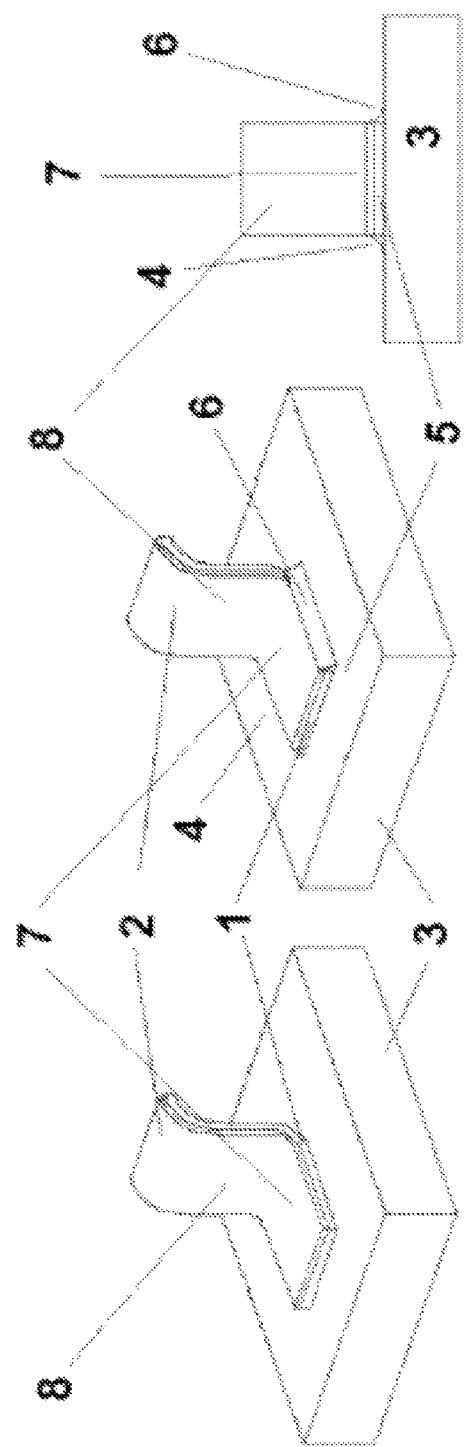
Figure 3:
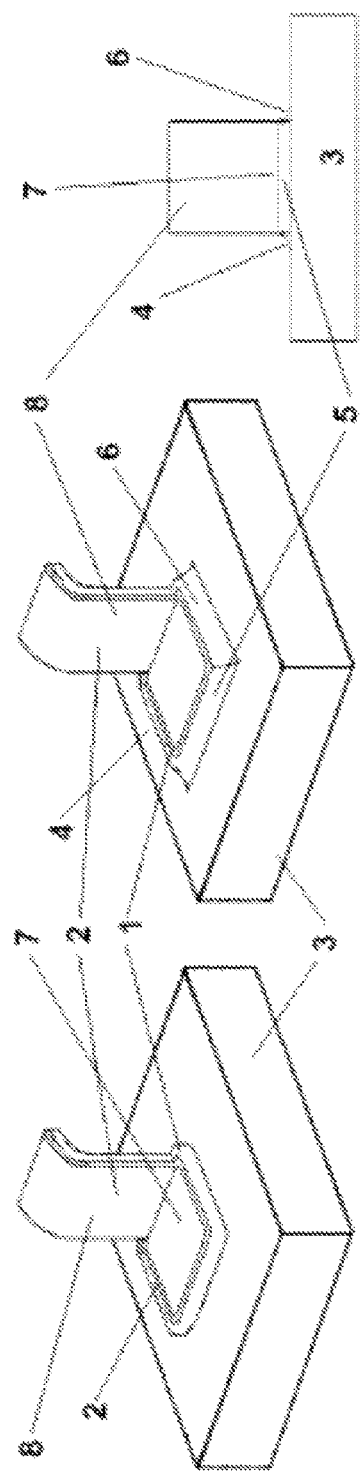
Figure 4:
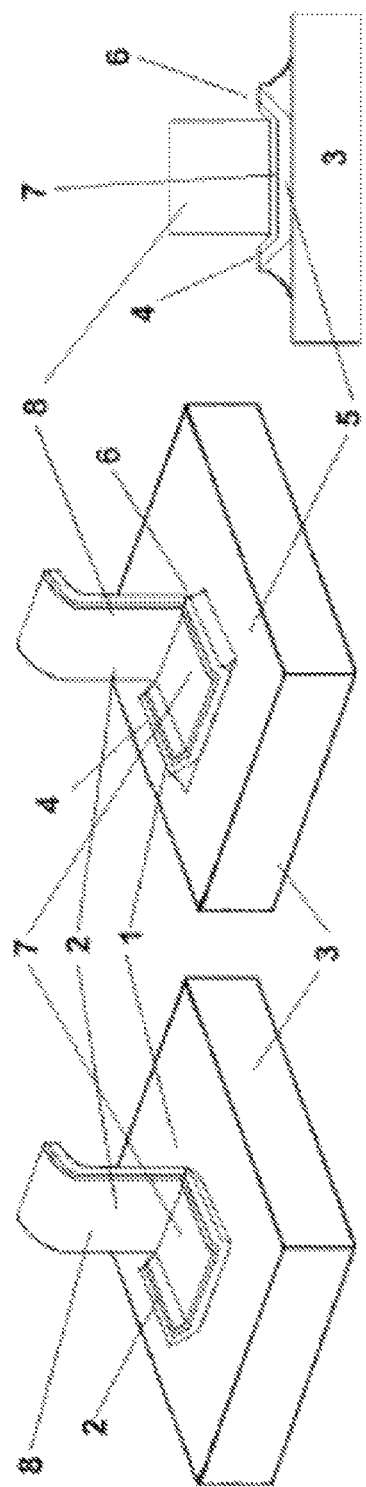
Figure 6:
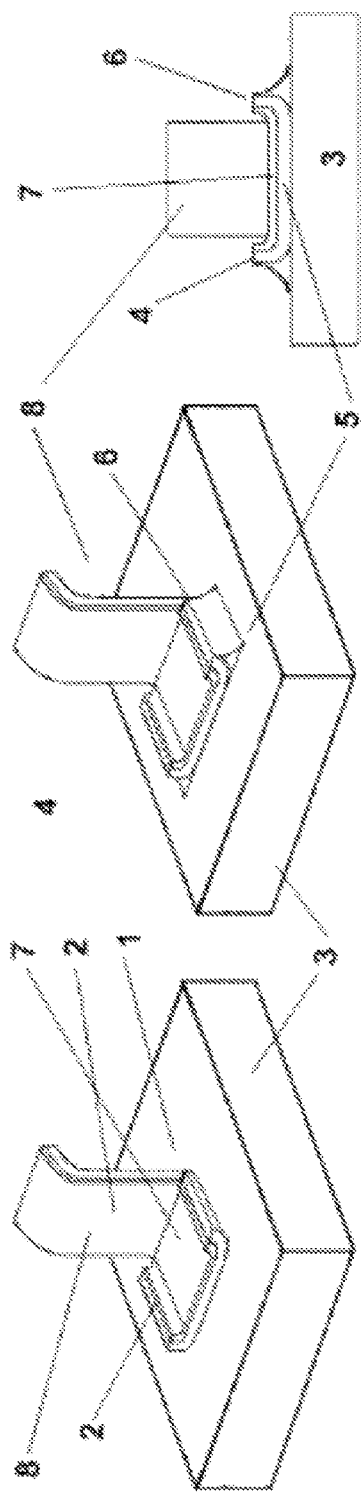
Figure 6:
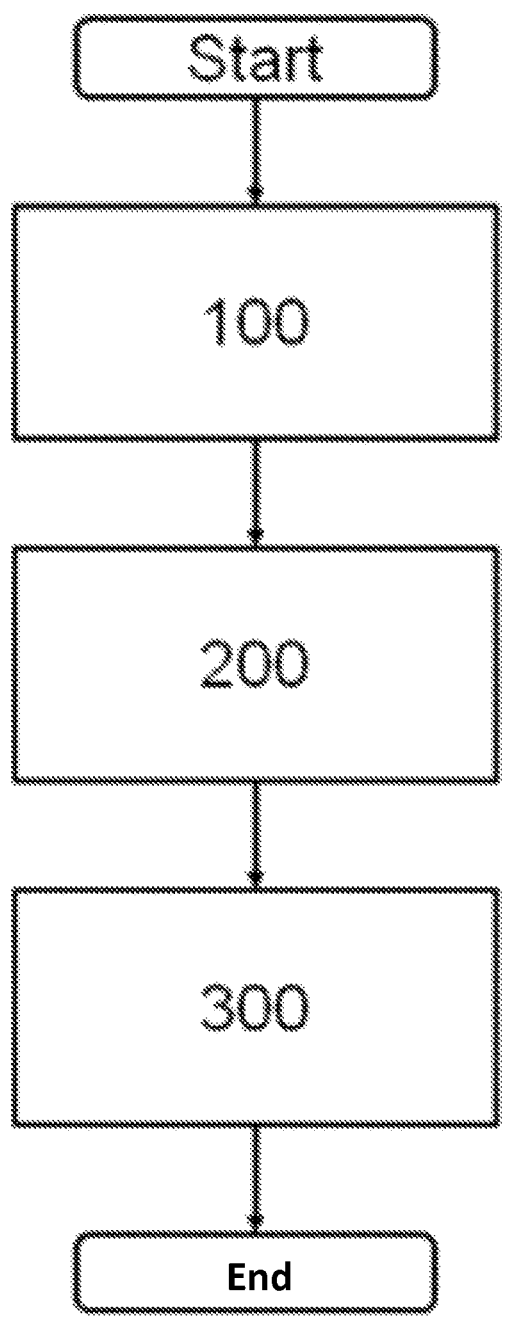

FIG. 1 a method for producing SMD contacts,

FIG. 2 a soldering process, together with the result of a conventionally designed connecting contact, FIG. 3 a soldering process, together with the result of a first embodiment according to the invention, FIG. 4 a soldering process, together with the result of a second embodiment according to the invention, FIG. 5 a soldering process, together with the result of a third embodiment according to the invention, and FIG. 6 a schematic flow diagram of a method of production according to the invention.

FIG. 1 shows a connecting contact, produced according to the conventional technique. This contact is typically punched, in the direction of the arrow S, out of a large sheet 2, which is provided with a coating 1. As is clear from the illustration, essentially no coating 1 is provided on the cut edge.

Although a certain drawing of the coating 1 along the cut edge is to be expected depending on the punching direction, this generally is not sufficient to satisfy the requirements with regard to quality and particularly with regard to standards such as the IEC 60068-2-58.

Therefore, in the past it has always been necessary to augment the coating 1, which was produced by fire pretinning or with galvanically remelted tin (Sn), for example, by post-finishing the surface of at least part of the cut edges, because soldering on the uncoated cut edges generally is unsatisfactory.

This is readily clear, for example, in FIG. 2, where the front surface 5 of the soldered connection, in contrast to side surfaces 4 and 6, has not been post-processed.

In contrast, a connecting contact according to the invention has at least one segment of the edge region of the laminar contact area which protrudes such that, when contacted with a circuit board 3 via soldering, a soldered fillet is formed on the edge region 4, 5, 6. A soldered fillet is also formed on the back side of the curved edge, which is not described in greater detail.

This is clear particularly from the trough-shaped embodiment illustrated in FIG. 3, for example. Here, the edge region 4, 5, 6 is deformed in such a way that a trough forms in relation to the laminar contact area 7.

When the connecting contact is placed on a circuit board 3 and suitably heated, an effective soldering point can form, since the trough-shaped embodiment favors the formation of a high soldered fillet.

This formation of the soldered fillets along edge regions 4, 5 and 6 is clear from the perspective view at the center of FIG. 3, and from the plan view on the right side of FIG. 3.

The formation of soldered fillets and the size thereof are decisive for the stability of the soldered connection. The invention therefore makes it possible to create more stable connections than was previously possible. Moreover, the invention saves at least one post-processing step that is otherwise necessary and is associated with defects, and therefore, the method overall results in cost-effective connecting contacts.

In an alternative embodiment according to FIG. 4, in a connecting contact according to the invention, at least one segment of the edge region of the laminar contact area protrudes in such a way that, when contacted with a circuit board 3 via soldering, a soldered fillet is formed on the edge region 4, 6.

In this case, the edge region 4 and 6 is deformed such that a U-shape is formed in relation to the laminar contact area 7.

In a further alternative embodiment according to FIG. 5, in a connecting contact according to the invention, at least one segment of the edge region of the laminar contact area protrudes in such a way that, when contacted with a circuit board 3 via soldering, a soldered fillet is formed on the edge region 4, 6.

In this case, the edge region 4 and 6 is deformed such that a U-shape is formed in relation to the laminar contact area 7.

Without being restricted to the embodiment according to FIGS. 3 to 5, it is obvious to a person skilled in the art that segments of an edge region or edge regions having other forms are also suitable.

As is clear from FIGS. 3 to 5, the connecting contact further comprises a conductive section 8.

In the illustrated embodiments, the edge regions 4 and 6 are arranged substantially parallel to the conductive section 8 on the laminar contact area 7.

Naturally, other forms of the contact area and the associated edge regions are also conceivable, however, a substantially parallel arrangement of individual edge regions has proven expedient when a plurality of connecting contacts are to be arranged side by side on an SMD component.

The dimensions of the connecting contact can be chosen to satisfy different requirements.

For instance, the dimensions can be chosen substantially based on the viewpoint of a soldering technician, which will result in dimensions such that the height of the soldered fillet corresponds substantially to its depth. The edge region then protrudes by a magnitude of approximately 0.25 to 2 material thicknesses of the metal sheet 2 above the laminar contact area 7.

Alternatively, the dimensions can be chosen, for example, substantially based on the viewpoint of a machinist, which will result in dimensions, the magnitude of which results in a substantially greater distance, since this can be achieved by a simpler bending. If the distance is smaller, a pre-bending followed by a final bending may be necessary. Nevertheless, post-tempering of the cut surfaces 4, 5, 6 also is not necessary in this case.

The edge region then protrudes by a magnitude of approximately 0.25 to 20 material thicknesses of the metal sheet 2 above the laminar contact area 7.

Naturally, the dimensions can also take both viewpoints into account and can represent a reasonable compromise.

In the embodiment according to FIG. 3 and FIG. 5, sections of the edge region 4 and 6 form an angle of approximately 90° with the surface contact area 7. In FIG. 3, the edge region 5 also forms an angle of approximately 90° with the laminar contact area 7.

In the embodiment according to FIG. 4, sections of the edge region 4 and 6 form an angle of approximately 45° with the surface contact area 7.

It is obvious that this angle refers to the end region of the edge, and that the invention and the claims thereof also encompass curved embodiments of the edge region.

As was described above in reference to FIG. 3, the edge region 5 can also be designed to protrude from the laminar contact area 7 such that, when contacted with a circuit board 3 via soldering, a soldered fillet is formed. This end region 5 is arranged substantially perpendicular to the conductive section 8 on the laminar contact area 7.

A method according to the invention for producing connecting contacts for SMD components for solderable contacting with a circuit board 3 is illustrated in the flow diagram according to FIG. 6.

In a first step 100, metal strips 1, 2 are punched.

In a further step 200, the metal strips 1, 2 are bent so as to produce a conductive region 8 and a laminar contact area 7.

In yet a further step 300, edge regions 4, 5, 6 are formed on the laminar contact area 7, such that at least one segment of the edge region 4, 5, 6 protrudes from the laminar contact area 7 in such a way that when contacted with a circuit board 3 via soldering, a soldered fillet is formed.

In one embodiment of the method, the step of forming 300 edge regions 4, 5, 6 comprises bending.

In a further embodiment, the step of forming 300 and the step of bending 200 are implemented in a single step.

In a further embodiment, the step of forming 300 and the step of bending 200 and the step of punching 100 are implemented in a single step.

LIST OF REFERENCE SIGNS

1 Coating
2 Metallic material
3 Circuit board
4, 5, 6 Edge region
7 Laminar contact area
8 Conductive section

The invention claimed is:

1. A connecting contact for SMD components and configured for solderable contact with a circuit board, the connecting contact comprising:
   a metallic material (2), the metallic material (2) at least partially comprising a coating (1) with a different metallic material,
   wherein the connecting contact has a substantially laminar contact area (7) configured for solderable contact with the circuit board, and
   wherein the laminar contact area has edge regions (4, 5, 6), wherein at least one segment of the edge regions (4, 5, 6) protrudes from the laminar contact area (7) such that, when the connecting contact is soldered to the circuit board (3), a soldered fillet is formed and an edge region (4, 6) is arranged substantially parallel to a conductive section (8) on the laminar contact area (7).

2. The connecting contact according to claim 1, wherein the edge region (4, 5, 6) protrudes above the laminar contact area (7) up to twenty times a thickness of the metallic material.

3. The connecting contact according to claim 1, wherein the edge region (4, 5, 6) protrudes above the surface contact area (7) up to two times a thickness of the metallic material.

4. The connecting contact according to claim 1, wherein segments of the edge region (4, 5, 6) form an angle of approximately 45° to approximately 90° with the laminar contact area (7).

5. The connecting contact according to claim 1, wherein the connecting contact has an edge region (5), which is arranged substantially perpendicular to the conductive section (7) on the laminar contact area.

\* \* \* \* \*